(12) United States Patent
Oraw

(10) Patent No.: US 9,142,535 B2
(45) Date of Patent: Sep. 22, 2015

(54) VERTICALLY PRINTING LEDS IN SERIES

(71) Applicant: Nthdegree Technologies Worldwide Inc., Tempe, AZ (US)

(72) Inventor: Bradley Steven Oraw, Chandler, AZ (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 31 days.

(21) Appl. No.: 14/150,199

(22) Filed: Jan. 8, 2014

(65) Prior Publication Data

US 2014/0209936 A1 Jul. 31, 2014

Related U.S. Application Data

(60) Provisional application No. 61/759,137, filed on Jan. 31, 2013.

(51) Int. Cl.
*H01L 33/00* (2010.01)
*H01L 25/075* (2006.01)
*H01L 33/38* (2010.01)
*H01L 33/42* (2010.01)
*H01L 33/44* (2010.01)

(52) U.S. Cl.
CPC .......... *H01L 25/0756* (2013.01); *H01L 33/387* (2013.01); *H01L 33/42* (2013.01); *H01L 33/44* (2013.01); *H01L 2933/0033* (2013.01)

(58) Field of Classification Search
CPC ............... H01L 27/15; H01L 25/0756; H01L 2933/0033; H01L 33/387; H01L 33/42; H01L 33/44; H01L 2924/12041; H01L 33/06; H01L 25/167; H01L 33/08

USPC ....................................................... 257/88–93
See application file for complete search history.

(56) References Cited

U.S. PATENT DOCUMENTS

| | | | |
|---|---|---|---|
| 7,259,030 B2 | 8/2007 | Daniels et al. | |
| 7,327,081 B2 | 2/2008 | Lo et al. | |
| 7,994,524 B1* | 8/2011 | Chung et al. | 257/90 |
| 8,242,518 B2 | 8/2012 | Lerman et al. | |
| 2010/0157583 A1* | 6/2010 | Nakajima | 362/184 |
| 2010/0219426 A1 | 9/2010 | Kim et al. | |
| 2012/0164796 A1 | 6/2012 | Lowenthal et al. | |
| 2012/0217046 A1 | 8/2012 | Hu et al. | |
| 2012/0268931 A1* | 10/2012 | Lerman et al. | 362/235 |

OTHER PUBLICATIONS

PCT/US14/11607 International Search Report and Written Opinion dated May 6, 2014, 11 pages.

* cited by examiner

*Primary Examiner* — Thanh T Nguyen
(74) *Attorney, Agent, or Firm* — Patent Law Group LLP; Brian D. Ogonowsky

(57) ABSTRACT

A first layer of first vertical light emitting diodes (VLEDs) is printed on a conductor surface. A first transparent conductor layer is deposited over the first VLEDs to electrically contact top electrodes of the first VLEDs. A second layer of second VLEDs is printed on the first transparent conductor layer. Since the VLEDs are printed as an ink, the second VLEDs are not vertically aligned with the first VLEDs, so light from the first VLEDs is not substantially blocked by the second VLEDs when the VLEDs are turned on. A second transparent conductor layer is deposited over the second VLEDs to electrically contact top electrodes of the second VLEDs. By this structure, the first VLEDs are connected in parallel, the second VLEDs are connected in parallel, and the first layer of first VLEDs and the second layer of second VLEDs are connected in series by the first transparent conductor layer.

13 Claims, 3 Drawing Sheets

VERTICALLY PRINTING LEDS IN SERIES

CROSS-REFERENCE TO RELATED APPLICATIONS

This application is based on U.S. provisional application Ser. No. 61/759,137, filed Jan. 31, 2013, by Bradley Steven Oraw, assigned to the present assignee and incorporated herein by reference.

FIELD OF THE INVENTION

This invention relates to forming a light emitting diode (LED) lamp, formed generally as a flat sheet using an array of LEDs, and, in particular, to a printing method for forming such LEDs in series using vertical printing.

BACKGROUND

FIG. 1 generally illustrates a prior art technique for forming a wide area light sheet or panel using LEDs. A starting substrate 10 may be Mylar or other type of polymer sheet, or even a metal sheet. A conductor layer 12 is then deposited over the substrate 10, such as by printing. The substrate 10 and/or conductor layer 12 is preferably reflective. A reflective film may also be provided on the front or back surface of the substrate 10.

An LED ink is provided, which comprises microscopic vertical LEDs 14 (e.g., 30 microns in diameter) uniformly infused in a solvent. The LEDs are initially formed as metallized semiconductor layers on a carrier wafer. Trenches are photolithographically etched through the semiconductors layers and the metal layers to define the boundaries of each LED. The back surface of the carrier wafer is then thinned until the individual LEDs are separated. The LEDs are then dispersed in the solvent to create the ink.

The LED ink is screen printed over the conductor layer 12. The orientation of the LEDs can be controlled by providing a relatively tall top electrode 16 (e.g., the anode electrode), so that the top electrode 16 orients upward by taking the fluid path of least resistance through the solvent after printing. The LED ink is heated to evaporate the solvent, and the bottom cathode electrode 18 and conductor layer 12 are annealed to create an ohmic cathode connection.

A dielectric 19 is deposited and etched to expose the top electrode 16.

A transparent conductor layer 20 is then printed to contact the top electrodes 16.

Metal bus bars 22 and 24 are then printed and cured to electrically contact the conductor layers 12 and 20 along their edges. A suitable voltage differential applied to the bus bars 22/24 turns on the LEDs 14. Although the microscopic LEDs 14 are randomly distributed, they are fairly uniformly distributed over the area of the flat sheet due to the large number of LEDs printed. There may be millions of LEDs 14 printed on a one square meter substrate 10. The fabrication process may be performed under atmospheric conditions.

The LEDs 14 in the monolayer, within a defined area, are connected in parallel by the conductor layers 12/20 since the LEDs 14 have the same orientation. If many LEDs 14 are connected in parallel, the driving voltage must approximately equal the voltage drop of a single LED 14 and the current is relatively high. The high current flowing laterally through at least the thin transparent conductor layer 20 creates a significant IR drop, since typical transparent conductors may have a conductivity of 1 ohm/square. This results in power loss and heat, lowering the efficiency of the lamp. Making the transparent conductor layer 20 thicker adds cost and increases the light absorption by the layer 20.

Further detail of forming such a light source by printing microscopic vertical LEDs, and controlling their orientation on a substrate, can be found in US application publication US 2012/0164796, entitled, Method of Manufacturing a Printable Composition of Liquid or Gel Suspension of Diodes, assigned to the present assignee and incorporated herein by reference.

It is common to connect discrete LEDs in series by using printed circuit boards and other techniques. By connecting LEDs in series, the driving voltage increases and the driving current is lowered. However, such electrical interconnections are impractical for printed LEDs, since the LEDs are randomly positioned and microscopic. Further, using lateral conductors to connect a layer of LEDs in series uses significant substrate area, creating noticeable dark areas between the LEDs and lowering the brightness-to-area ratio of the lamp.

What is needed is a practical and cost-effective technique for connecting printed LEDs in series while still obtaining a high density of LEDs for a good brightness-to-area ratio.

SUMMARY

In one embodiment, microscopic LEDs are infused in a solvent to form an LED ink for printing, such as screen printing. The LEDs are vertical LEDs, with one electrode (e.g., an anode) on top and the other electrode (e.g., a cathode) on the bottom.

A substrate is provided with a first conductor layer. The LEDs are printed, as a monolayer, on the conductor layer, with their anode electrodes orientated up, and the bottom cathode electrodes are annealed to make ohmic contact to the first conductor layer.

A dielectric is deposited over the LEDs, followed by a transparent second conductor layer, which makes ohmic contact with all of the top anode electrodes. Therefore, this first layer of LEDs is connected in parallel by the first and second conductor layers.

Over the second conductor layer is printed a second monolayer of LEDs, which may be identical to the first layer of LEDs. A dielectric is deposited over the second layer of LEDs, and a transparent third conductor layer is deposited, which makes ohmic contact to the anode electrodes of the second layer of LEDs. Therefore, the second layer of LEDs is connected in parallel by the second conductor layer and the third conductor layer.

The first layer of LEDs is connected in series with the second layer of LEDs, since the anode electrodes of the first layer of LEDs are connected to the cathode electrodes of the second layer of LEDs via the second conductor layer. Since the LEDs are randomly arranged in each layer (i.e., not vertically aligned), the light from the LEDs in the first layer will typically have a direct path through the overlying dielectric layer and transparent conductor layers.

The transparent second conductor layer may be made very thin since, most of the current through the second conductor layer flows vertically and only slightly laterally until it is conducted by an LED in the second LED layer. Therefore, there is little light attenuation by the second conductor layer and very little power loss.

Metal bus bars are printed along opposite edges of all the conductor layers for good current distribution across the conductor layers. Thin metal runners may be printed between the bus bars to improve the current distribution for large area light sheets.

A driving voltage is coupled between the first conductor layer and the third conductor layer to turn on all the LEDs with the proper orientation. Since the LEDs are in series, the current conducted by the conductor layers is one half of the current which would have been conducted had all the LEDs been connected in parallel.

Additional LED layers may be printed to connect additional LEDs in series and further lower the current.

By lowering the current through the conductors, the conductors have a lower IR drop and/or may be made thinner.

Additionally, since the overall density of the series-connected LEDs is greater than the density of lateral-connected LEDs (since the series-connected LED layers overlap), the brightness-to-area ratio is greatly increased.

In another embodiment, a dielectric layer may be inserted over the transparent second conductor layer, and another transparent conductor layer may be printed over the dielectric layer for contacting the bottom cathode electrodes of the second layer of LEDs. This allows completely independent control over the driving of the first layer of LEDs and the second layer of LEDs. This also provides the option of externally connecting the LEDs in series.

By independently driving the layers of LEDs, the LEDs may be different types and colors, and the overall combined color may be dynamically controlled.

A phosphor or quantum dot layer may be added to wavelength-convert some of the LED light to generate any color.

The light sheet may be fabricated using a conveyor system at atmospheric pressures. Other embodiments are described.

BRIEF DESCRIPTION OF THE DRAWINGS

FIG. 3 is taken along line 3-3 in FIG. 4.

Elements that are similar or identical in the various figures are labeled with the same numeral.

DETAILED DESCRIPTION

The GaN-based micro-LEDs used in embodiments of the present invention are less than a third the diameter of human hair, rendering them essentially invisible to the naked eye when the LEDs are sparsely spread across a substrate to be illuminated. The number of micro-LED devices per unit area may be freely adjusted when applying the micro-LEDs to the substrate. A well dispersed random distribution across the surface can produce nearly any desirable surface brightness. Lamps well in excess of 10,000 cd/m$^2$ have been demonstrated by the assignee. The LEDs may be infused in a solvent and printed as an ink using screen printing or other forms of printing, and the orientations of the LEDs on the substrate are controllable by, for example, the shape of the top electrode. A tall electrode causes the tall electrode to be the top electrode about 90% of the time. Further detail of forming a light source by printing a monolayer of microscopic vertical LEDs, controlling their orientation on a substrate, and connecting them in parallel can be found in US application publication US 2012/0164796, entitled, Method of Manufacturing a Printable Composition of Liquid or Gel Suspension of Diodes, assigned to the present assignee and incorporated herein by reference.

Figure 1:
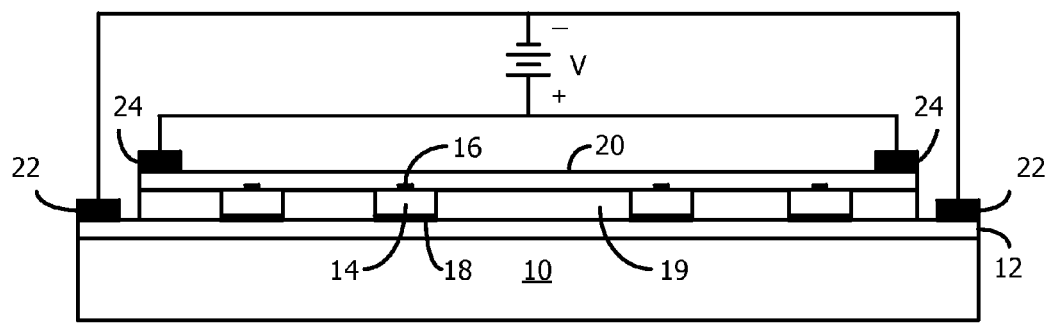
FIG. 1 is a simplified cross-section of a prior art light sheet with an array of vertical LEDs sandwiched between two conductor layers to connect the LEDs in parallel.

In contrast to the prior art FIG. 1, the present invention forms any number of printed LEDs in series by printing overlapping layers of LEDs to reduce the current through the conductor layers and increase the density of LEDs to increase the brightness-to-area ratio.

Figure 2:
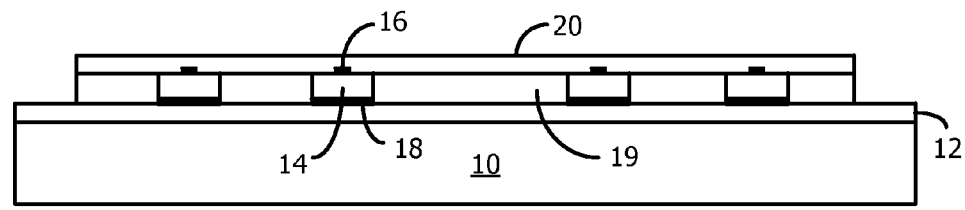
FIG. 2 is a simplified cross-section of a light sheet in accordance with one embodiment of the invention during fabrication.

FIG. 2 illustrates one embodiment of an inventive light sheet (or panel) during fabrication.

In one embodiment, an LED wafer, containing many thousands of vertical LEDs, is fabricated so that the metal anode electrode 16 for each LED 14 has a small footprint to allow light to escape the anode side, and the metal cathode electrode 18 for each LED 14 forms a bottom reflector for each LED 14. The anode and cathode surfaces may be opposite to those shown. The top surface of the LEDs 14 may be roughened by etching to increase light extraction (i.e., decrease internal reflections).

The LEDs 14 are completely formed on the wafer, including the anode and cathode metallizations, by using one or more carrier wafers during the processing and removing the growth substrate to gain access to both LED surfaces for metallization. After the LEDs are formed on the wafer, trenches are photolithographically defined and etched in the front surface of the wafer around each LED, to a depth equal to the bottom electrode, so that each LED has a diameter of about 30 microns and a thickness of about 6 microns. A preferred shape of each LED is hexagonal. The back surface of the wafer is then thinned until the LEDs are singulated. The LEDs 14 of FIG. 2 result. The microscopic LEDs 14 are then uniformly infused in a solvent to form an LED ink for printing, such as screen printing.

Many other ways can be used to form the LEDs 14, and the LEDs 14 do not need to be microscopic or printed for the present invention to apply.

If it is desired for the anode electrodes 16 to be oriented in a direction opposite to the substrate 10 after printing, the electrodes 16 are made tall so that the LEDs are rotated in the solvent, by fluid pressure, as they settle on the substrate surface. The LEDs rotate to an orientation of least resistance. Over 90% like orientation has been achieved, although satisfactory performance may be achieved with over 75% of the LEDs being in the same orientation.

The starting substrate 10 is preferably as thin as practical for ease of handling, low weight, and low cost, and provides suitable mechanical strength to the light sheet. The substrate 10 may be a suitable polymer, such as Mylar or PMMA, and may be dispensed from a roll. The substrate 10 can be any size, such as one square meter across, since no vacuum processing is needed for fabrication, and the process may be performed using a conveyor system. In one embodiment, the bottom surface of the substrate 10 has a thin reflective metal film deposited on it.

On top of the substrate 10 is deposited a conductor layer 12, such as a metal layer formed of copper, aluminum, or an alloy. The conductor layer 12 is preferably reflective to visible light.

The LEDs 14 are then printed on the conductor layer 12 such as by screen printing with a suitable mesh to allow the LEDs to pass through and control the thickness of the layer. The LEDs 14 will be printed as a monolayer and be fairly uniformly distributed over the substrate 10. Any other suitable deposition process may be used. In the example of FIG. 2, the LEDs 14 are oriented so that the anode electrodes 16 are the top electrodes.

The LED ink solvent is then evaporated by heat, such as using lamps. The LEDs 14 are then annealed in an optical furnace, also using lamps, to rapidly heat the electrodes to form an ohmic connection between the bottom cathode electrodes 18 and the conductor layer 12. Millions of LEDs 14 may be deposited in the single layer.

A transparent dielectric layer 19 is then printed over the entire surface to encapsulate the LEDs 14 and secure them in position. The top surface of the dielectric layer 19 is then blanket etched, such as by a wet etching or mechanical etching, to expose the top anode electrodes 16.

A transparent conductor layer 20 is then printed over the dielectric layer 19 to electrically contact the electrodes 16. The conductor layer 20 may be ITO or may include silver nanowires. The electrodes 16 may be annealed in an optical furnace to create good ohmic contact to the conductor layer 20.

Figure 3:
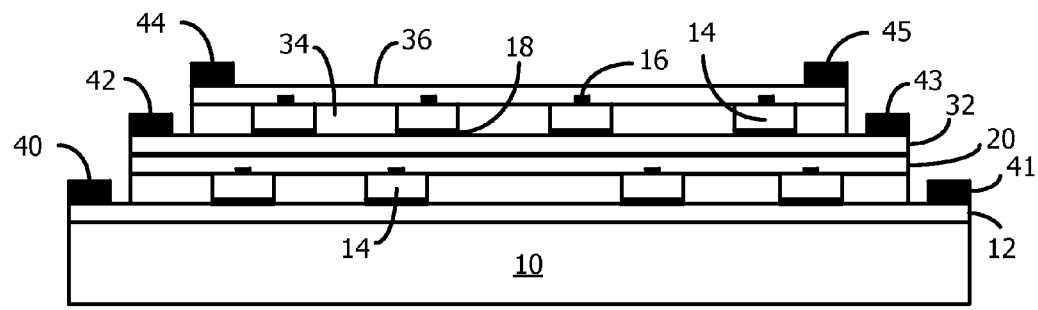
FIG. 3 illustrates the light sheet of FIG. 2 after additional fabrication steps to form two layers of LEDs in series.

As shown in FIG. 3, another transparent conductor layer 32 is printed over the conductor layer 20.

The LED ink is then again printed over the conductor layer 32 to form a second layer of LEDs 14, which may be identical to the LEDs 14 in the first layer or different. In one embodiment, all the LEDs 14 are the same and emit blue light. A phosphor layer, to be later deposited, is used to cause the light sheet to emit white light or any other color.

In another embodiment, the conductor layers 20 and 32 are formed as a single layer, and the electrodes in the first and second layers of LEDs 14 are annealed in a single step to make ohmic contact to both sides of the conductor layer.

The following steps may be identical to those described with respect to FIG. 2. The LED ink solvent is then evaporated by heat, such as using lamps. The LEDs 14 in the second layer are then annealed in an optical furnace to rapidly heat the electrodes to form an ohmic connection between the bottom cathode electrodes 18 and the conductor layer 32.

A transparent dielectric layer 34 is then printed over the entire surface to encapsulate the LEDs 14 and secure them in position. The top surface of the dielectric layer 34 is then blanket etched, such as by a wet etching or mechanical etching, to expose the top anode electrodes 16.

A transparent conductor layer 36 is then printed over the dielectric layer 34 to electrically contact the electrodes 16. The conductor layer 36 may be ITO or may include silver nanowires. The electrodes 16 may be annealed in an optical furnace to create good ohmic contact to the conductor layer 36.

The LEDs 14 in each layer are thus connected in parallel, and the two layers of LEDs 14 are connected in series. Additional overlapping layers of LEDs 14 may be printed to add more LEDs in series.

The various layers are printed so that edge areas of the conductor layers 12, 32, and 36 are exposed.

Metal bus bars 40-45 are then screen printed along opposite edges of the conductor layers 12, 32, and 36 for connection to one or more voltage/current sources. The metal is then annealed by an optical furnace. The bus bars will ultimately be connected to a voltage differential for turning on the LEDs 14. The points of connection between the bus bars and the driving voltage leads should be at least on two ends of each bus bar to more uniformly distribute current along the bus bars. The bus bars on opposite edges of a conductor layer are shorted together, either by the printed metal or an external connection.

The bus bars 42 and 43, connected to the middle conductor layer 32, are optional if the two layers of LEDs 14 are to be driven by a single voltage/current source.

Figure 4:
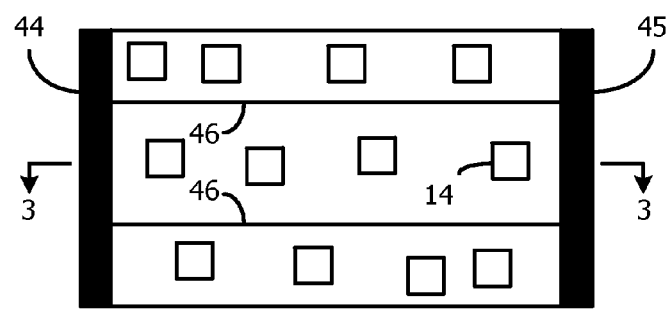
FIG. 4 is a top down view of only the top layer of LEDs in FIG. 3, where

FIG. 4 is a top down view of the structure of FIG. 3, where FIG. 3 is taken along line 3-3 in FIG. 4. Only the second layer of LEDs 14 is illustrated for simplicity. The LEDs 14 in the first layer would also be visible in a top down view, since the various layers are transparent and the LEDs 14 in the layers would be offset due to their random positions in the layers.

If the light sheet is wide, there will be a significant IR drop across at least the transparent conductor layer 36. Thin metal runners 46 may be printed along the surface of the conductor layer 36 between the two bus bars 44 and 45 to cause the conductor layer 36 to have a more uniform voltage, resulting in more uniform current spreading.

The resulting structure may be less than 1 mm thick.

Figure 5:
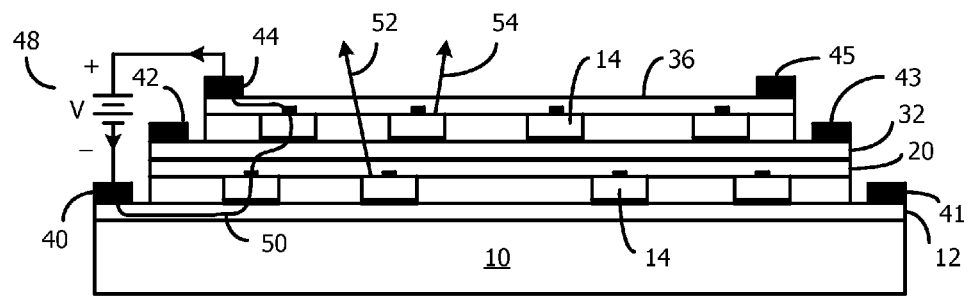
FIG. 5 illustrates a current path through two LEDs in series and also illustrates light rays emitted from the top surfaces of two LEDs.

FIG. 5 illustrates the structure of FIG. 3 when a driving voltage 48 is applied across the conductor layers 12 and 36 to turn all the LEDs 14 on. The same driving voltage 48 is applied to the opposite edges of the conductor layers 12 and 36 via the bus bars 40, 41, 44, and 45. Current 50 spreads along the bottom conductor layer 12 (which may be metal) and enters the cathode electrodes 18 of each of the LEDs 14. The current flows vertically through each of the LEDs 14 in the first layer, then flows both vertically and slightly laterally through the conductor layers 20 and 32 until conducted by an LED 14 in the second layer of LEDs 14. The conductor layers 20 and 32 may be very thin since the current through them does not flow laterally a significant distance. Further, the conductor layers 20 and 32 may be made more transparent by reducing their conductivity without significant power loss.

The current 50 flows vertically generally through the nearest overlying LEDs 14 and completes the circuit through the top transparent conductor layer 36.

Since the various layers are very thin and transparent, and the conductor layer 12 or the substrate 10 is reflective, there is little light absorption. There is also less IR loss since the current supplied to the conductor layers 12 and 36 is one-half that supplied to the conductor layers 12 and 20 in FIG. 1.

Since the two layers of LEDs 14 in FIG. 5 have twice the density as the single layer of LEDs 14 in FIG. 1, the brightness-to-area ratio is doubled. FIG. 5 illustrates light rays 52 and 54 being emitted from two LEDs 14. Since the LEDs 14 are extremely small and randomly positioned (not vertically aligned), the LEDs 14 in the second layer will typically not directly overlie the LEDs 14 in the first layer. Hence, a majority of light exiting the LEDs in the first layer is not blocked by the LEDs in the second layer. Further, since the bottom electrodes 18 of the LEDs are reflective, any impinging light is reflected and ultimately exits the light sheet. The relative size of the LEDs 14 in FIG. 5 is greatly exaggerated, and the spacings of the LEDs 14 are greatly compressed for ease of illustration.

Figure 6:
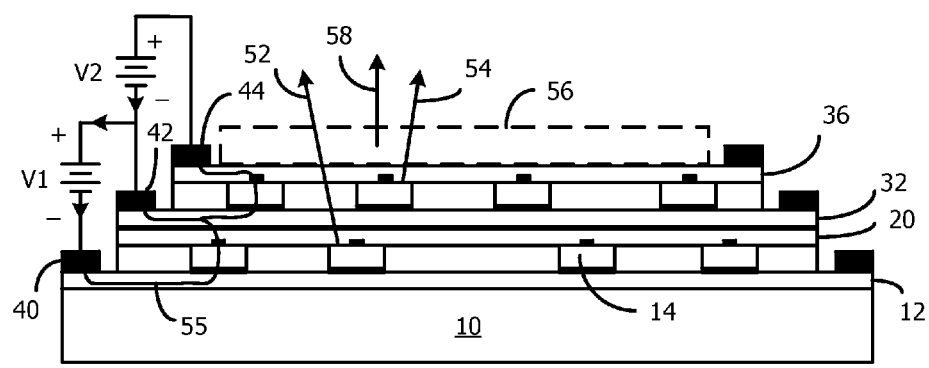
FIG. 6 illustrates another embodiment of the invention using two voltage/current sources to drive the respective LED layers for independent control of the two layers.

FIG. 6 illustrates how the driving voltages for the two layers of LEDs 14 can be independent by coupling one voltage V1 between the conductor layers 12 and 32, and coupling another voltage V2 between the conductor layers 32 and 36. This is useful when the LEDs 14 in the different layers are different types of LEDs 14 or it is desired to make one layer of LEDs 14 brighter than the other layer. The current 55 is shown flowing through the series LEDs 14 and to the voltage/current supplies.

FIG. 6 also shows the use of a printed phosphor layer 56 over the top surface of the conductor layer 36. The phosphor layer 56 passes some of the blue LED light and converts a portion of the LED light to another wavelength, such as yellow (shown as light ray 58). The combination of the light may be white or other color. Other wavelength-converting layers may be used, such as a quantum dot layer.

Figure 7:
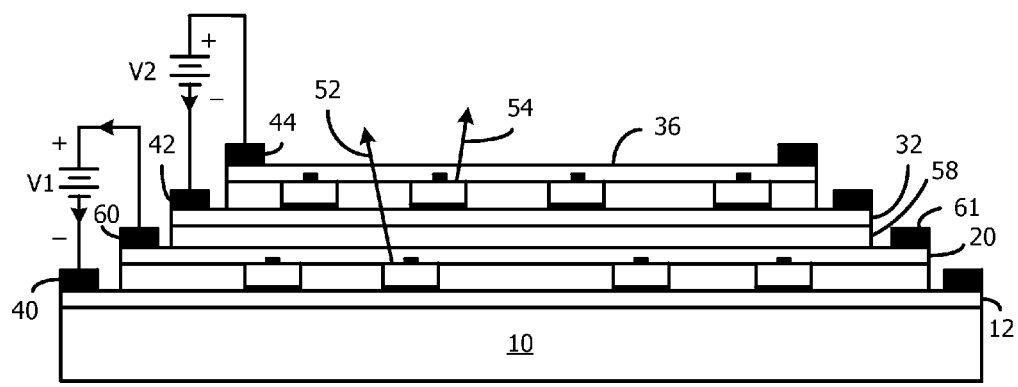
FIG. 7 illustrates another embodiment of the invention where there is a dielectric layer between the two middle conductor layers to enable a variety of electrical connections between the two LED layers.

FIG. 7 illustrates the use of an additional transparent dielectric layer 58 between the conductor layers 32 and 20. Metal bus bars 60 and 61 are formed on the edges of the conductor layer 20. The dielectric layer 58 electrically insulates the two layers of LEDs 14 to create a 4-terminal light sheet. The two layers of LEDs 14 are show driven by the voltages V1 and V2. The layers of LEDs 14 may be connected in series by an external connection, shorting the conductor layer 20 to the conductor layer 32. The configuration of FIG. 7 may be useful if the LEDs 14 in each layer are different types of LEDs, requiring different driving voltages and currents to produce the desired brightness.

In all the embodiments, a single light sheet may be formed by multiple areas of LEDs tiled on a single substrate, where each separate area of LEDs comprises LEDs electrically connected in parallel and series by the various conductor layers. As an example, one strip of LEDs may be electrically isolated from an adjacent strip as a result of the pattern used during the screen printing of the LEDs and conductor layers. In this way, the separate strips may be connected together in series and/or parallel, or isolated, by metal patterns on the light sheet to achieve the desired electrical characteristics of the light sheet. Dividing the LEDs into areas also reduces the required current for each conductor layer and improves reliability in the event of a short or open circuit. Each strip may be a centimeter wide or less and contain thousands of LEDs. By enabling driving the strips with different voltages, different types of LEDs (having different forward voltages) may be used in adjacent strips to combine the different colors from the strips. In one embodiment, red, green, and blue LEDs are in adjacent narrow strips to create white light without a phosphor.

A single light sheet may be more than a meter across and any length. Each of the figures may represent a single strip or area in a larger light sheet or may represent the entire light sheet. The various metal bus bars may be interconnected in any manner.

The substrate 10 may be provided with a release layer to allow the remaining layers to be removed from the substrate 10, creating a more efficient light sheet having a thickness of only 20-80 microns. Such a light sheet is extremely flexible and may be adhered to another type of substrate, including a fabric for clothing.

The light sheets can be used for general illumination, displays, backlights, indicator lights, etc.

Figure 8:
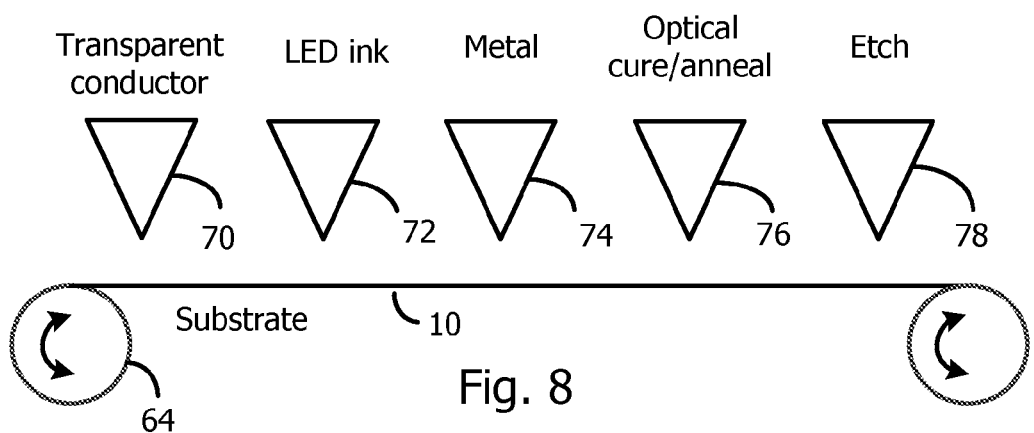
FIG. 8 illustrates how the embodiments may be inexpensively and quickly fabricated using a conveyor system at atmospheric pressures.

Since all the layers may be printed and heated using lamps, the light sheet may be manufactured using a conveyor system at atmospheric pressures, as shown in FIG. 8. FIG. 8 illustrates the substrate 10 being dispensed from a roll 64. The substrate 10 is moved under various process stations to print layers, heat/cure/anneal the layers, and etch the layers, as described above. Shown in FIG. 8 are a transparent conductor printing station 70, an LED ink printing station 72, a metal printing station 74, an optical cure/anneal station 76, and a wet or dry etching station 78.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An illumination structure comprising:
   a conductor surface;
   a first layer of first vertical light emitting diodes (VLEDs) distributed on the conductor surface, the first VLEDs having a bottom electrode electrically contacting the conductor surface;
   a first dielectric layer between the first VLEDs;
   a first transparent conductor layer overlying the first VLEDs and first dielectric layer, the first VLEDs having a top electrode electrically contacting the first transparent conductor layer;
   a second layer of second VLEDs distributed on the first transparent conductor layer, the second VLEDs having a bottom electrode electrically contacting the first transparent conductor layer, the second layer of second VLEDs overlying the first layer of first VLEDs;
   a transparent second dielectric layer between the second VLEDs; and
   a second transparent conductor layer overlying the second VLEDs and second dielectric layer, the second VLEDs having a top electrode electrically contacting the second transparent conductor layer,
   wherein the first VLEDs are connected in parallel by the conductor surface and the first transparent conductor layer,
   wherein the second VLEDs are connected in parallel by the first transparent conductor layer and the second transparent conductor layer,
   wherein the first layer of first VLEDs and the second layer of second VLEDs are connected in series by the first transparent conductor layer; and
   wherein the first VLEDs and the second VLEDs are not vertically aligned so that a majority of light exiting the first VLEDs is not blocked by the second VLEDs when the first VLEDs and the second VLEDs are turned on.

2. The structure of claim 1 wherein the first transparent conductor layer comprises two transparent conductor layers deposited back to back.

3. The structure of claim 1 wherein the first VLEDs are randomly distributed over the conductor surface, and the second VLEDs are randomly distributed over the first transparent layer.

4. The structure of claim 1 wherein the conductor surface comprises a conductive layer formed on a substrate.

5. The structure of claim 1 further comprising a substrate supporting the conductor surface.

6. The structure of claim 5 wherein the substrate is conductive.

7. The structure of claim 1 wherein the first VLEDs and the second VLEDs are printed as an ink comprising a solvent.

8. The structure of claim 1 wherein the first VLEDs and the second VLEDs are microscopic VLEDs randomly distributed over the conductor surface and the first transparent conductor layer.

9. The structure of claim 1 further comprising metal bus bars contacting the first transparent conductor layer and the second transparent conductor layer.

10. The structure of claim 1 further comprising a wavelength conversion layer overlying the second transparent conductor layer.

11. The structure of claim 1 further comprising:
a first electrode contacting the conductor surface;
a second electrode contacting the first transparent conductor layer;
a third electrode contacting the second transparent conductor layer;
a first voltage connected between the first electrode and the second electrode for turning on the first VLEDs; and
a second voltage connected between the second electrode and the third electrode for turning on the second VLEDs.

12. The structure of claim 1 further comprising:
a first electrode contacting the conductor surface;
a second electrode contacting the second transparent conductor layer; and
a first voltage connected between the first electrode and the second electrode for turning on the first VLEDs and the second VLEDs.

13. The structure of claim 1 wherein the structure is flexible.

\* \* \* \* \*